US012720804B2

(12) United States Patent
Zhang et al.

(10) Patent No.: US 12,720,804 B2
(45) Date of Patent: Aug. 25, 2026

(54) HIGH-TEMPERATURE IMPLANT FOR GATE-ALL-AROUND DEVICES

(71) Applicant: Applied Materials, Inc., Santa Clara, CA (US)

(72) Inventors: Yan Zhang, Westford, MA (US); Taegon Kim, Gloucester, MA (US); Johannes M. Van Meer, Middleton, MA (US); Vikram M. Bhosle, North Reading, MA (US); Jae Young Lee, Bedford, MA (US); Naushad K. Variam, Marblehead, MA (US)

(73) Assignee: Applied Materials, Inc., Santa Clara, CA (US)

( * ) Notice: Subject to any disclaimer, the term of this patent is extended or adjusted under 35 U.S.C. 154(b) by 469 days.

(21) Appl. No.: 18/227,275

(22) Filed: Jul. 27, 2023

(65) Prior Publication Data

US 2025/0040186 A1 Jan. 30, 2025

(51) Int. Cl.

| | |
|---|---|
| ***H10D 30/67*** | (2025.01) |
| ***H10D 30/01*** | (2025.01) |
| ***H10D 62/10*** | (2025.01) |
| ***H10W 20/00*** | (2026.01) |

(52) U.S. Cl.

CPC ....... *H10D 30/6735* (2025.01); *H10D 30/014* (2025.01); *H10D 30/6757* (2025.01); *H10D 62/121* (2025.01); *H10W 20/0526* (2026.01)

(58) Field of Classification Search

CPC . H10D 30/6735; H10D 30/014; H10D 30/019

See application file for complete search history.

(56) References Cited

U.S. PATENT DOCUMENTS

| | | | | |
|---|---|---|---|---|
| 6,720,213 | B1 | 4/2004 | Gambino | |
| 7,227,230 | B2 | 6/2007 | Gambino | |
| 2006/0234519 | A1* | 10/2006 | Pan | H10D 30/014 257/E29.241 |
| 2022/0384202 | A1* | 12/2022 | Lin | H01L 21/31138 |
| 2023/0054701 | A1* | 2/2023 | Xie | H10D 30/43 |
| 2024/0387669 | A1* | 11/2024 | Siao | H10D 30/6735 |

* cited by examiner

*Primary Examiner* — Davienne N Monbleau
*Assistant Examiner* — Emily Farmer
(74) *Attorney, Agent, or Firm* — KDW Firm PLLC

(57) ABSTRACT

Approaches herein provide devices and methods for forming gate-all-around transistors with improved gate spacer k-values. One method may include forming a gate-all-around (GAA) stack including a plurality of alternating first layers and second layers, and forming a source/drain (S/D) cavity through the plurality of alternating first layers and second layers. The method may further include forming an inner spacer in the S/D cavity, adjacent the plurality of alternating first layers and second layers, performing a first implant by directing fluorine ions to the GAA stack, through the S/D cavity, wherein the first implant is performed at a temperature greater than 30° Celsius and forming a S/D material in the S/D cavity following the first implant.

17 Claims, 5 Drawing Sheets

HIGH-TEMPERATURE IMPLANT FOR GATE-ALL-AROUND DEVICES

FIELD OF THE DISCLOSURE

The present embodiments relate to semiconductor device patterning, and more particularly, to devices and techniques for forming gate-all-around transistors using a high-temperature implant to reduce k-value of gate spacers.

BACKGROUND OF THE DISCLOSURE

As integrated circuit (IC) technologies progress towards smaller technology nodes, multigate devices have been used to improve gate control by increasing gate-channel coupling, reducing off-state current, and reducing short-channel effects (SCEs). A multigate device generally refers to a device having a gate structure, or portion thereof, disposed over more than one side of a channel region. Fin-like field effect transistors (FinFETs) and gate-all-around (GAA) transistors, both also referred to as non-planar transistors, are examples of multigate devices that provide high performance and low leakage applications. The channel region of GAA transistors may be formed from nanowires, nanosheets (NS), or other nanostructures.

For GAA-based devices, the dielectric constant (k-value) of gate spacers, including outer and inner spacers, is one of the critical knobs to reduce the parasitic capacitance, which is inversely proportional to the device switch frequency. However, reducing the k-value is challenging due to the unique and complex structure of the gate spacers of GAA devices.

Accordingly, improved approaches are needed for forming GAA transistors.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include forming a gate-all-around (GAA) stack comprising a plurality of alternating first layers and second layers, and forming a source/drain (S/D) cavity by etching the plurality of alternating first layers and second layers. The method may further include forming an inner spacer in the S/D cavity, adjacent the plurality of alternating first layers and second layers, performing a first implant by directing fluorine ions to the GAA stack, through the S/D cavity, wherein the first implant is performed at a temperature greater than 500 C° Celsius, and forming a S/D material in the S/D cavity following the first implant.

In another aspect, a method for forming a gate-all-around (GAA) device may include forming a nanowire stack comprising a plurality of alternating first layers and second layers and an outer gate spacer adjacent the plurality of alternating first layers and second layers and forming a source/drain (S/D) cavity by etching the plurality of alternating first layers and second layers, and by etching the outer gate spacer. The method may further include forming an inner spacer in the S/D cavity, adjacent the plurality of alternating first layers and second layers, and performing a first implant by directing fluorine ions into the inner spacer of the nanowire stack, through the S/D cavity, wherein the first implant is performed at a temperature greater than 500 C Celsius. The method may further include annealing the nanowire stack at a first temperature after the first implant is performed.

In yet another aspect, a system may include a processor and a memory storing instructions executable by the processor to perform a first implant by directing fluorine ions into a gate-all-around (GAA) stack comprising a plurality of alternating first layers and second layers, wherein the fluorine ions are directed through a source/drain cavity formed adjacent the GAA stack, wherein the first implant is performed at a temperature greater than 500° C. Celsius, and wherein the outer gate spacer and an inner spacer are formed along the GAA stack before the fluorine ions are directed through the source/drain cavity.

BRIEF DESCRIPTION OF THE DRAWINGS

The accompanying drawings illustrate exemplary approaches of the disclosure, including the practical application of the principles thereof, as follows.

Figure 1A:
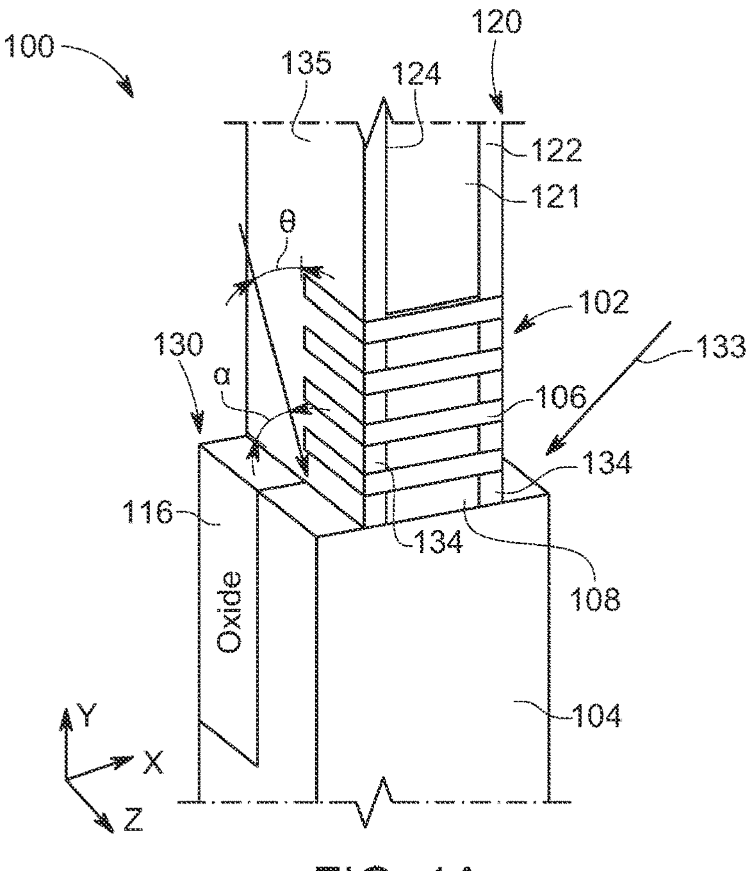
FIG. 1A illustrates a perspective view of an exemplary device following a S/D cavity formation, according to embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods, systems, and devices in accordance with the present disclosure will now be described more fully hereinafter with reference to the accompanying drawings, where various embodiments are shown. The methods, systems, and devices may be embodied in many different forms and are not to be construed as being limited to the embodiments set forth herein. Instead, these embodiments are provided so the disclosure will be thorough and complete, and will fully convey the scope of the methods to those skilled in the art.

Embodiments described herein are directed to formation of gate-all-around (GAA) transistors in which a source/drain (S/D) cavity is implanted with fluorine (F) or F and carbon (C) for reduction in the dielectric constant (k-value) of gate spacers. Advantageously, compared to an atomic layer deposition (ALD) process, for example, the F or F+C implant process cost is lower. Furthermore, as compared to a carbon only implant, there is a lower possibility to degrade Ion/Ioff and SCEs, as F has a low solubility in Si and is more easily segregated into Si/dielectric interfaces. Thus, at the end of the process, there will be negligible F dose remaining in Si. In addition, C-doped dielectric materials may have C loss during subsequent processing and therefore the C-induced k-value reduction may not be retained.

In another advantage, device DC performance (e.g., Ion/Ioff, drain-induced barrier lowering (DIBL), subthreshold slope (SS)) won't be affected. Instead, AC performance will be improved due to reduced k-value of the inner spacer.

In another advantage, as compared to prior F implants performed at room temperature, lower damage on Si is achieved with a hot implant.

In yet another advantage, if ions are being delivered using a plasma doping (PLAD) process, e.g., using SiF4 or other species, good conformity can be obtained. This is especially important for doping in high aspect ratio structures (e.g., CFET).

With reference to FIG. 1, an approach for forming a semiconductor device (hereinafter "device") 100 according to one or more embodiments will be described. The device 100 may be a GAA device structure, a vertical GAA device structure, a horizontal GAA device structure, or a fin-like field effect transistor (FinFET) device structure. In some embodiments, the device 100 may be a stacked nanosheet complementary field effect transistor (CFET) device having a GAA structure. As shown, the device 100 may include a GAA stack 102 (sometimes alternatively referred to herein as a nanosheet stack) including a substrate base 104 and a plurality of alternating first layers 106 and second layers 108 formed over the substrate base 104.

The term 'nanosheet,' as used herein, refers to a sheet or a layer having nanoscale dimensions. Further, the term 'nanosheet' is meant to encompass other nanoscale structures such as nanowires. For instance, 'nanosheet' can refer to a nanowire with a larger width, and/or 'nanowire' can refer to a nanosheet with a smaller width, and vice versa.

According to an exemplary embodiment, substrate base 104 may be a bulk semiconductor wafer, such as a bulk silicon (Si), bulk germanium (Ge), bulk silicon germanium (SiGe) and/or bulk III-V semiconductor wafer. Alternatively, the substrate base 104 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. The substrate base 104 may already have prebuilt structures (not shown) such as transistors, diodes, capacitors, resistors, interconnects, wiring, etc.

In various embodiments, the plurality of alternating first layers 106 and second layers 108 may include two to ten first layers 106 and two to ten second layers 108. A composition of the first layers 106 may be different than a composition of the second layers 108 to achieve etching selectivity and/or different oxidation rates during subsequent processing, for example. In some embodiments, the plurality of alternating first layers 106 and second layers 108 may include different materials, different constituent atomic percentages, different constituent weight percentages, and/or other different characteristics to achieve desired etching selectivity.

In the present embodiment, the first layers 106 may include silicon (Si) and the second layers 108 may include silicon germanium (SiGe), which has a different etch selectivity than silicon. Although non-limiting, a thickness of each first layer 106 may be about 1 nm to about 10 nm, a thickness of each second layer 108 may be about 1 nm to about 10 nm, and the two thicknesses can be the same or different. In some embodiments, the plurality of alternating first layers 106 and second layers 108 may be epitaxially grown in the depicted interleaving and alternating configuration, layer-by-layer, until a desired number of semiconductor layers is reached.

The nanosheet stack 102 may be processed (e.g., etched) to form a plurality of structures, or nanosheets, only one of which is shown, extending in a vertical direction from the substrate base 104. Each of the nanosheets may include a set of opposing sidewall surfaces, wherein adjacent nanosheets may be separated by a trench. The nanosheets may be patterned by any suitable method. For example, the nanosheets may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. Embodiments herein are not limited in this context.

As further shown, a dielectric material may be partially filled into a trench to form a shallow trench isolation (STI) layer 116 in the substrate base 104. The STI layer 116 may comprise at least one of silicon oxide, silicon nitride, and carbon. The STI layer 116 may be deposited by any deposition method such as flowable CVD (FCVD), PECVD, PVD, ALD, and MOCVD.

A dummy gate structure 120 may then be formed over the nanosheet stack 102, as shown. The dummy gate structure 120 may be formed atop the STI layer 116. In some embodiments, the dummy gate structure 120 includes a sacrificial gate having a gate material layer 121, wherein the gate material layer 121 may be formed atop an etch stop layer. In some embodiments, the gate material layer 121 may be an amorphous silicon (a-Si) or a polysilicon.

As further shown, a plurality of outer gate spacers 122 may be formed over the device 100, along a sidewall 124 of the gate material layer 121. The outer gate spacers 122 may then be partially removed (e.g., etched), as demonstrated, to expose a portion of the nanosheet stack 102, namely, the plurality of alternating first layers 106 and second layers 108. Partially removing the outer gate spacers 122 causes a source/drain (S/D) cavity 130 to be formed through etching the plurality of alternating first layers and second layers 106, 108. Although non-limiting, the outer gate spacers 122 may be formed of a dielectric material such as silicon nitride, silicon oxide, silicon carbo-nitride, silicon oxynitride, silicon oxy carbo-nitride, or the like, and may have a single-layer structure or a multi-layer structure including a plurality of dielectric layers.

After formation of the S/D cavity 130, a lateral selective dry etch may be performed to trim the SiGe second layers 108 slightly (e.g., a few nm) to form gaps between Si nanosheets. One or more low-k materials may then be used to fill these gaps and form an inner spacer 134. In various non-limiting embodiments, low-k materials may include an oxygen-containing dielectric having a dielectric constant less than about 7, for example, less than about 5, or even less than about 2.5. Non-limiting examples of such materials may include SiOC, SiON, SiOCN, etc.

A first implant process 133 may then be performed whereby fluorine ions are directed as beamline ions into the GAA stack 102, after formation of the S/D cavity 130 and the inner spacer 134. In some embodiments, the first implant process 133 may further include directing carbon ions into the GAA stack 102 together with the fluorine ions. The fluorine ions, or the fluorine+carbon ions, are directed into the exposed surfaces of the GAA stack 102 and into the inner spacer 134 at a non-zero angle θ relative to a plane (y-z plane) defined by an exterior surface 135 of the outer gate spacers 122. In some embodiments, the first implant process 133 is performed at a high temperature (e.g., greater than approximately 500 C). In other embodiments, the first implant process 133 is performed at a temperature no less than approximately 500° C. using a Thermion implant tool to reduce damage on Si of the GAA stack 102 and to minimize any impact to subsequent S/D epi growth. Furthermore, in some embodiments, twist and tilt angles (e.g., angle α) of the fluorine ions, or the fluorine+carbon ions, can be adjusted to enable adequate doping and uniformity. An optional thermal prebake or annealing process may then be performed (e.g., rapid thermal anneal (RTA)) to drive the fluorine into the channel regions. In some embodiments, thermal prebake or annealing process may be performed at a temperature greater than 700° C.

Figure 1B:
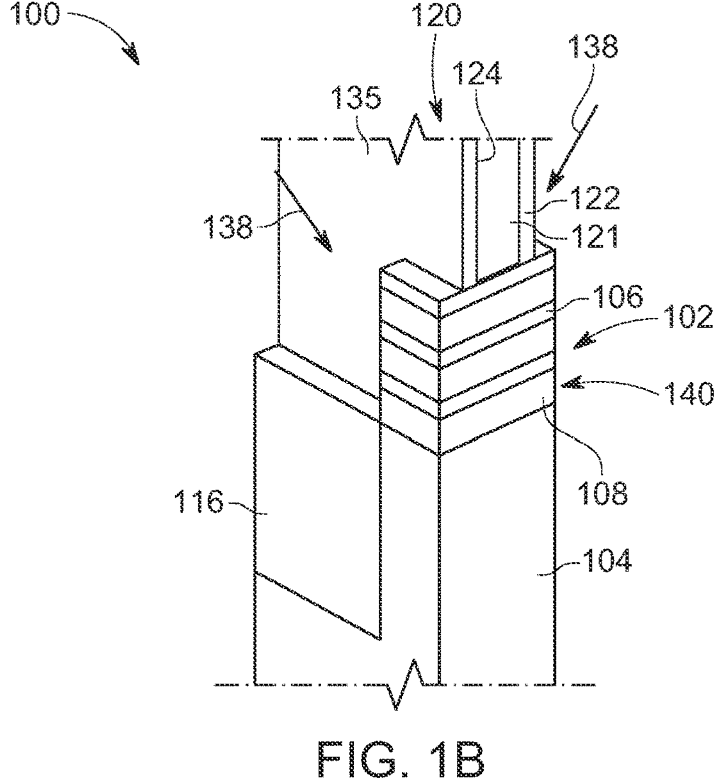
FIG. 1B illustrates a perspective view of an exemplary ion treatment prior to a S/D cavity formation, according to embodiments of the present disclosure.

In some embodiments, as shown in FIG. 1B, a second implant process 138 may be performed, before the S/D cavity 130 is formed, by directing fluorine ions, or fluorine+carbon ions, to the outer spacer 122 and the GAA stack 102. The second implant process 138 may be performed at room temperature or at a hot temperature (e.g., 400-500° C.), and may be directed to the outer spacer 122 at a non-zero angle relative to the plane defined by the exterior surface 135 of the outer gate spacers 122. Furthermore, in some embodiments, twist and tilt angles of the ions of the second implant process 138 can be adjusted to enable adequate doping and uniformity.

As shown, the second implant process 138 is done before S/D cavity formation and thus the alternating first layers 106 and second layers 108 are present during the second implant process 138. As a result, the second implant process 138 may dope the outer gate spacer 122. Following the second implant process 138, a portion 140 of the plurality of alternating first layers 106 and second layers 108 may be removed to form the S/D cavity 130, and the fluorine ions or the fluorine+carbon ions of the first implant process 133 may be delivered to the GAA stack 102, as described above and shown in FIG. 1A.

Figure 1C:
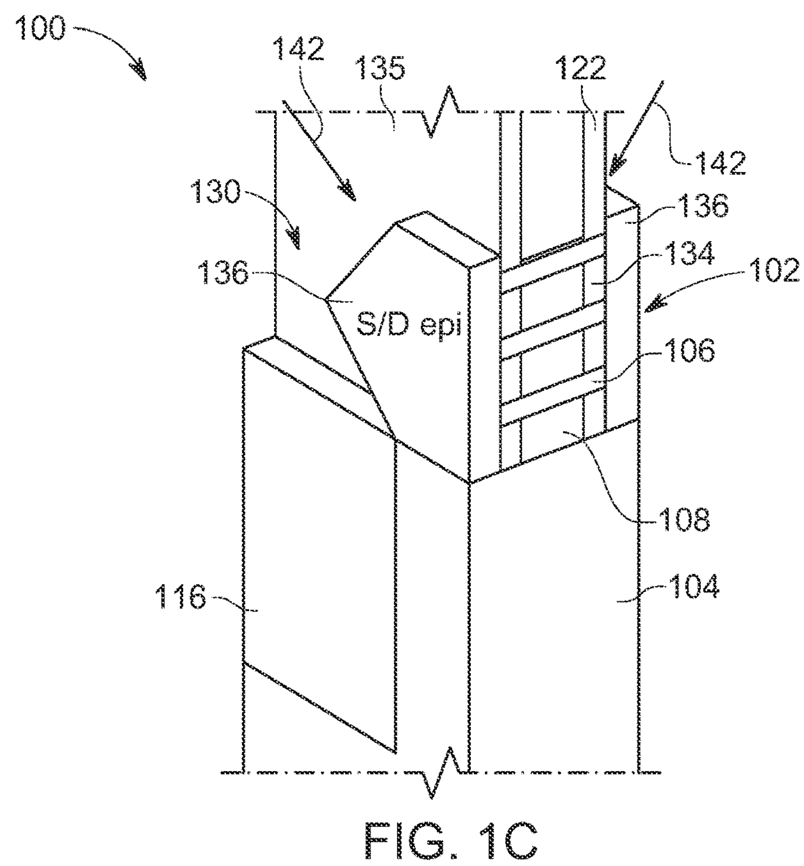
FIG. 1C illustrates a perspective view of an exemplary ion treatment following formation of a S/D material, according to embodiments of the present disclosure.

In other embodiments, as shown in FIG. 1C, a third implant process 142 may be performed following formation of a S/D material within the S/D cavities 130, wherein the S/D material is used to form a set of S/Ds 136. The third implant process 142 may include directing fluorine ions, or fluorine+carbon ions, to outer gate spacer 122 of the GAA stack 102, wherein the third implant process 142 may be performed after the first implant process 133. In some embodiments, the second implant process 138 may also be performed prior to performance of third implant process 142. Similar to other embodiments, the third implant process 142 may be performed at room temperature or at a hot temperature (e.g., 400-500° C.), and may also be directed to the gate outer spacers 122 at a non-zero angle relative to the plane defined by the exterior surface 135 of the outer gate spacers 122. Twist and tilt angles of the ions of the third implant process 142 can be adjusted to enable adequate doping and uniformity. The third implant process 142 may dope the outer gate spacer 122 to further reduce the k-value thereof.

In some embodiments, an epitaxy process to form the S/Ds 136 may use chemical vapor deposition (CVD) techniques (e.g., vapor phase epitaxy and/or Ultra-High Vacuum CVD), molecular beam epitaxy, other suitable epitaxial growth processes, or combinations thereof. The epitaxy process can use gaseous and/or liquid precursors, which interact with the composition of the substrate base 104 and the first layers 106 of the GAA stack 102. As shown, the S/Ds 136 may be in direct contact with the first layers 106 and in direct contact with the inner spacers 134.

In some embodiments, the S/D 136 may be doped with p-type dopants. For p-type transistors, the S/D 136 may include silicon germanium or germanium, and can be doped with boron, other p-type dopant, or combinations thereof (for example, forming Si:Ge:B epitaxial source/drain features). Furthermore, the doping can be in-situ (i.e., doped during deposition by adding impurities to a source material of the epitaxy process) or ex-situ (e.g., doped by an ion implantation process subsequent to a deposition process). In some embodiments, an annealing process (e.g., rapid thermal annealing (RTA) and/or laser annealing) may be performed to activate dopants in the S/D 136.

Although not shown, following formation of the S/D 136, the device 100 may be further processed using a RMG sequence whereby second layers 108 are removed from the GAA stack 102 using, for example, a wet etch process. In some embodiments, the etch process may be a lateral SiGe etch performed by a selective rapid plasma etch (SRP) device optimized to remove the second layers 108. Various etching parameters can be tuned to achieve selective etching, such as etchant composition, etching temperature, etching solution concentration, etching time, etching pressure, source power, RF bias voltage, RF bias power, etchant flow rate, other suitable etching parameters, or combinations thereof. In some embodiments, the etch may be a selective isotropic dry etching process (e.g., a surface gas/radical reaction process) to the second layers 108 with a fluorine-containing gas (e.g., HF, $F_2$, $NF_3$, $CF_4$, $SF_6$, $CH_2F_2$, $CHF_3$, and/or $C_2F_6$). In some embodiments, a ratio of the fluorine-containing gas to an oxygen-containing gas (e.g., $O_2$), an etching temperature, and/or an RF power may be tuned to selectively etch the second layers 108.

Figure 2A:
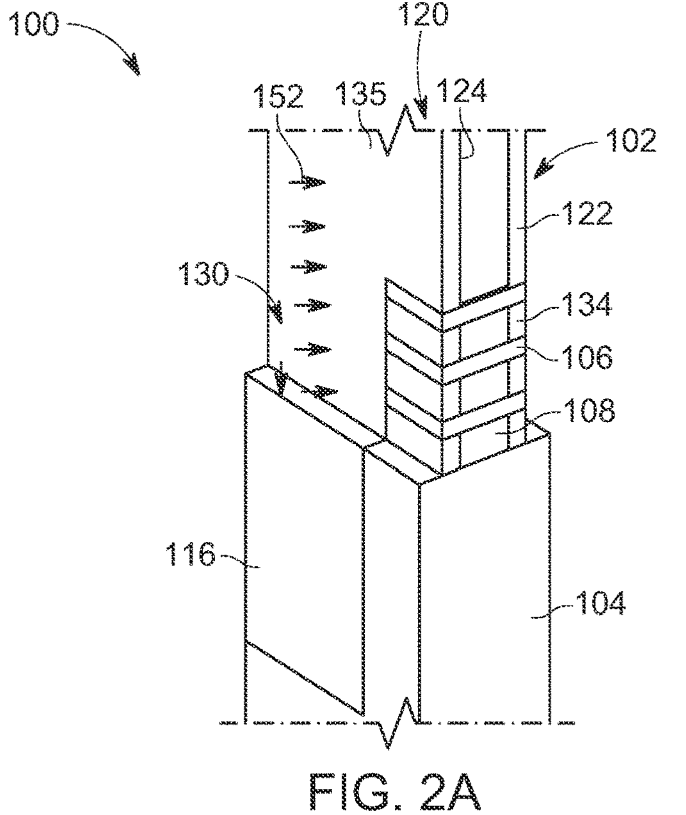
FIG. 2A illustrates a perspective view of an exemplary device following a S/D cavity formation, according to embodiments of the present disclosure.

FIG. 2A demonstrates an alternative, sidewall implant 152, which may be performed to the inner spacer 134 and to the GAA stack 102 after the S/D cavities 130 and inner spacer 134 are formed. In this embodiment, the sidewall implant 152 is a plasma treatment, e.g., plasma doping (PLAD) or decoupled plasma treatment (DPX), which impacts the first layer 106, the inner spacer 134, the outer spacer 122, and the STI layer 116. This plasma doping is preferably done at a high temperature (e.g., greater than 500 degrees Celsius) to avoid any potential damage on Si along the sidewall. Although non-limiting, the sidewall implant 152 may be plasma treatment including fluorine, or fluorine and carbon (e.g., SiF4, CH4, CF4, GeF4, etc.), wherein the plasma dose may be constant or variable. As a result of the sidewall implant 152, uniformity is improved, damage is minimized on the GAA stack 102, and any impact is minimized with respect to subsequent S/D epi growth. Furthermore, in some embodiments, an optional cavity liner to protect cavity surface (not shown) or partial epitaxially grown may be formed to avoid SiF4 etching effect on layer 106 within the S/D cavities 130 prior to the sidewall implant 152.

Figure 2B:
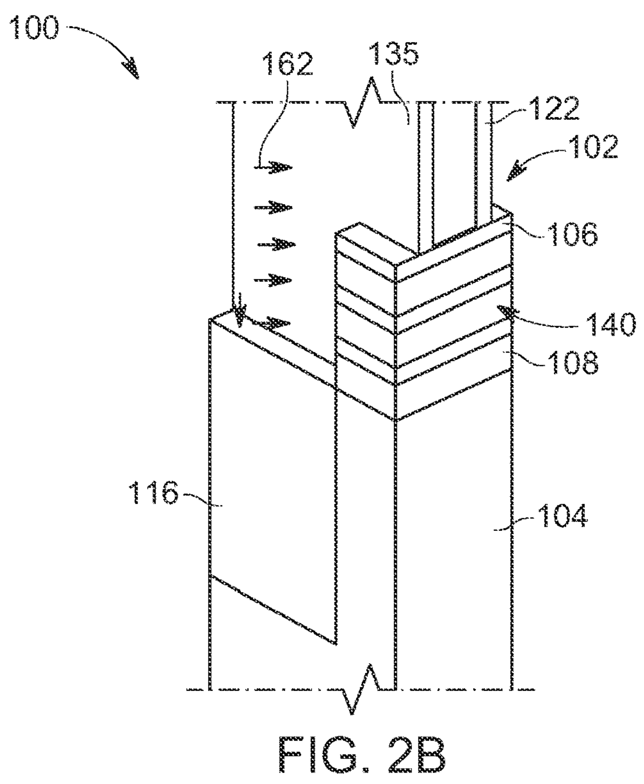
FIG. 2B illustrates a perspective view of an exemplary ion treatment prior to a S/D cavity formation, according to embodiments of the present disclosure.

In some embodiments, as shown in FIG. 2B, a second plasma treatment 162 may be performed, before the S/D cavity 130 is formed, by directing fluorine ions, or fluorine+carbon ions, to the GAA stack 102 and to the outer gate spacer 122, specifically. The second plasma treatment 162 may be performed at room temperature or at a hot temperature (e.g., 400-500° C.)

As shown, the portion 140 of the plurality of alternating first layers 106 and second layers 108 is present before and during the second plasma treatment 162. As a result, the second plasma treatment 162 may dope the outer gate spacer 122. Following the second plasma treatment 162, the portion 140 of the plurality of alternating first layers 106 and second layers 108 may be removed to form the S/D cavity 130, and the fluorine ions or the fluorine+carbon ions of the sidewall implant 152 may be delivered to the GAA stack 102, as described above and shown in FIG. 2A.

Figure 2C:
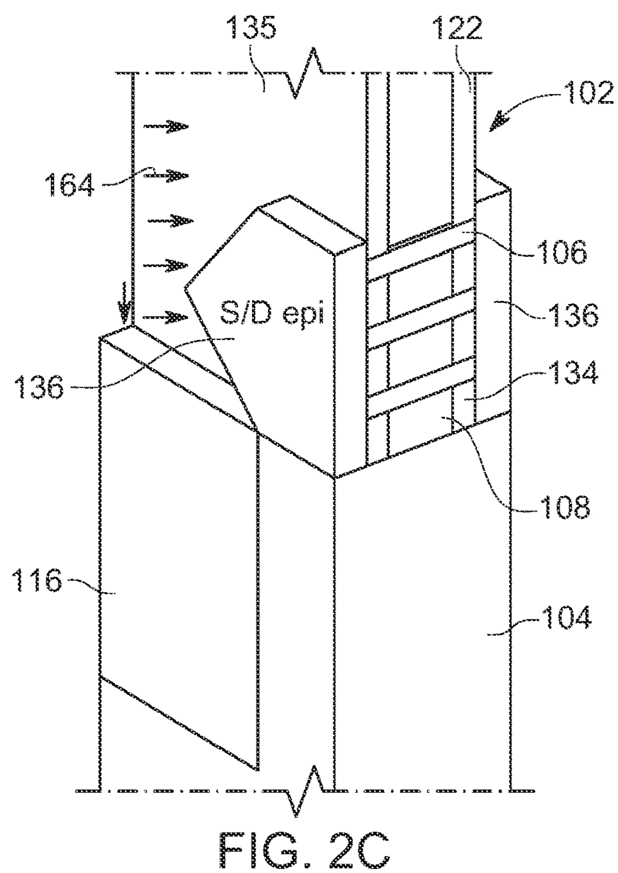
FIG. 2C illustrates a perspective view of an exemplary ion treatment following formation of a S/D material, according to embodiments of the present disclosure.

In other embodiments, as shown in FIG. 2C, a third plasma treatment 164 may be performed following formation of the set of S/Ds 136. The third plasma treatment 164 may include directing fluorine ions, or fluorine+carbon ions, to the outer gate spacer 122 of the GAA stack 102, wherein the third plasma treatment 164 may be performed after the sidewall implant 152. In some embodiments, the second plasma treatment 162 may also be performed prior to performance of the third plasma treatment 164. Similar to other embodiments, the third plasma treatment 164 may be performed at room temperature or at a hot temperature (e.g., 400-500° C.), and may also be directed to the GAA stack 102 at a non-zero angle relative to the plane defined by the exterior surface 135 of the outer gate spacers 122. The third plasma treatment 164 may dope the outer gate spacer 122 to further reduce the k-value thereof.

Although not shown, following the formation of the set of S/Ds 136, the device 100 may be further processed using a RMG sequence whereby second layers 108 are removed from the GAA stack 102 using, for example, a wet etch process. In some embodiments, the etch process may be a lateral SiGe etch performed by a selective rapid plasma etch (SRP) device optimized to remove the second layers 108. Various etching parameters can be tuned to achieve selective etching, such as etchant composition, etching temperature, etching solution concentration, etching time, etching pressure, source power, RF bias voltage, RF bias power, etchant flow rate, other suitable etching parameters, or combinations thereof. In some embodiments, the etch may be a selective isotropic dry etching process (e.g., a surface gas/radical reaction process) to the second layers 108 with a fluorine-containing gas (e.g., HF, $F_2$, $NF_3$, $CF_4$, $SF_6$, $CH_2F_2$, $CHF_3$, and/or $C_2F_6$). In some embodiments, a ratio of the fluorine-containing gas to an oxygen-containing gas (e.g., $O_2$), an etching temperature, and/or an RF power may be tuned to selectively etch the second layers 108.

Figure 3:
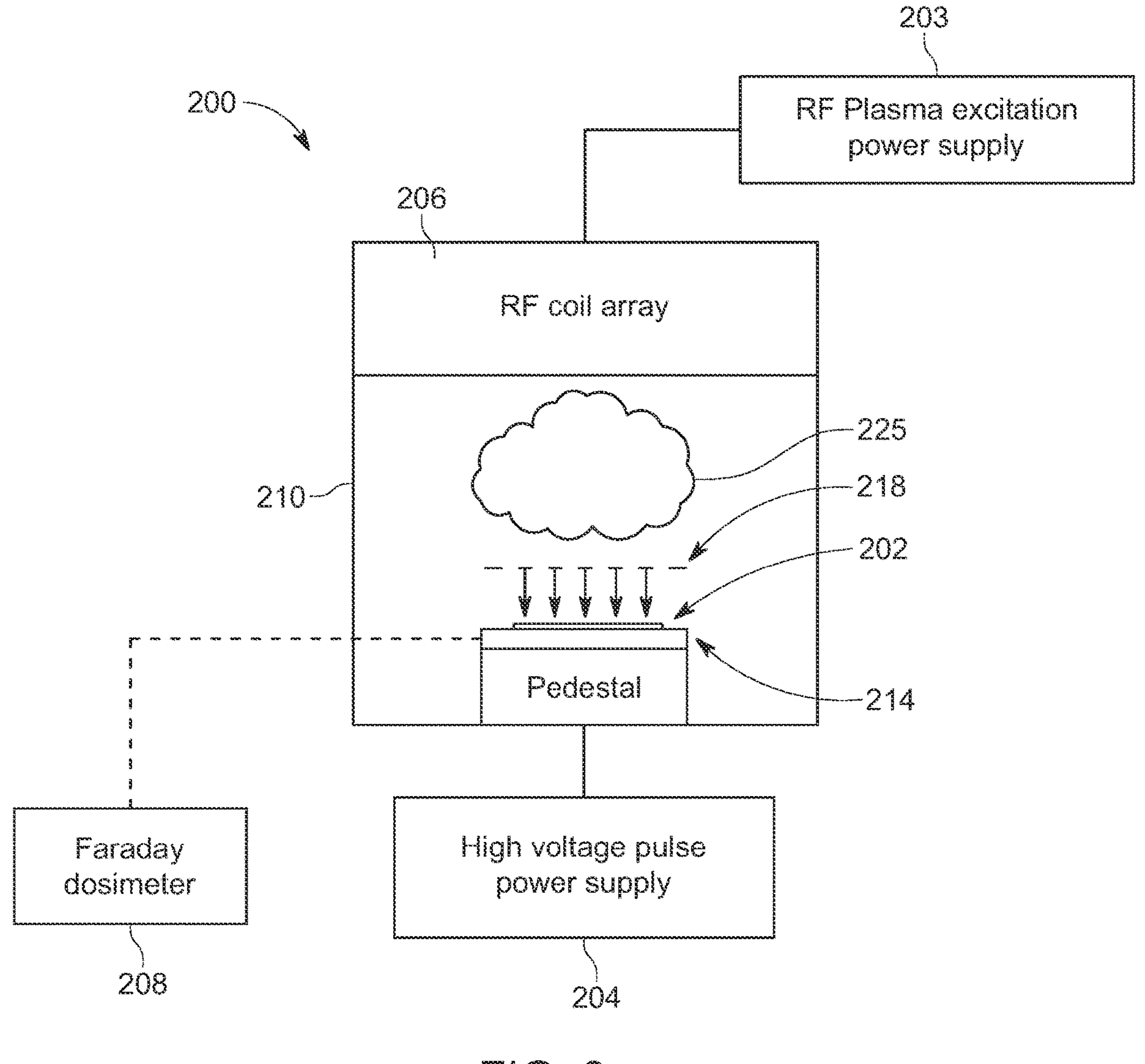
FIG. 3 illustrates a perspective view of an example plasma doping system, according to embodiments of the present disclosure.

Referring to FIG. 3, an example system 200 (e.g., a PLAD system) operable to provide pulsed RF-excited continuous plasma doping to the device 100 of FIGS. 2A-2C, will be described. As shown, the system 200 may include a plasma power supply 203, a voltage pulse power supply 204, an RF coil array 206, and a dosimeter 208. Within a plasma chamber 210 is a wafer/substrate 202, which may be the same or similar to the substrate base 104 described above. A platen/pedestal 214 may support the wafer 202, and a sheath 218 may be formed above the wafer 202. In some embodiments, the platen/pedestal 214 may be heated to allow the plasma treatment processes described herein to be performed at an elevated temperature. The dosimeter 208 may be a Faraday dosimeter or other type of sensor that directly measures the dose of ions received by the wafer 202. Although non-limiting, the dosimeter can be located on the pedestal 214, proximate to the wafer 202.

During use, the plasma power supply 203 and the RF coil array 206 deliver radio frequency excitation to generate a plasma 225 when gaseous species are delivered into the plasma chamber 210. For example, the plasma power supply 203 may be an RF powered inductively coupled power source to generate inductively coupled plasma 225, as known in the art. Gaseous species may be delivered from one or more gas sources (not separately shown) to generate ions of any suitable species, such as fluorine.

The voltage pulse power supply 204 may generate a bias voltage between the wafer 202 and the plasma chamber 210. As such, when the voltage pulse power supply 204 generates a voltage between the plasma chamber 210 and the substrate 202, a similar, but slightly larger, voltage difference is generated between the plasma 225 and the substrate 202. In one non-limiting example, a 5000 (5 kV) voltage difference established between the plasma chamber 210 and the substrate 202 (or, equivalently, pedestal 214) may generate a voltage difference of approximately 5005 V to 5030 V between the plasma 225 and the substrate 202.

In some embodiments, the voltage pulse power supply 204 may generate a bias voltage as a pulsed voltage signal, wherein the pulsed voltage signal is applied in a repetitive and regular manner, to generate a pulse routine comprising a plurality of extraction voltage pulses. For example, a pulse routine may apply voltage pulses of 500 V magnitude, 1000 V magnitude, 2000 V magnitude, 5000 V magnitude, or 10,000 V magnitude in various non-limiting embodiments. The system 200 may further include a controller (not shown), to control the pulsing routine applied to the substrate 202, in order to provide the sidewall implant 152.

When the plasma 225 is present in the plasma chamber 210, the controller may generate a signal for the voltage pulse power supply 204 to apply a pulse routine to the substrate 202, where the pulse routine constitutes a plurality of extraction voltage pulses. As such, when the extraction voltage pulses are applied between the substrate 202 and plasma 225, ions are extracted in pulsed form from the plasma 225, generating a plurality of ion pulses that are directed to the substrate 202.

Figure 4:
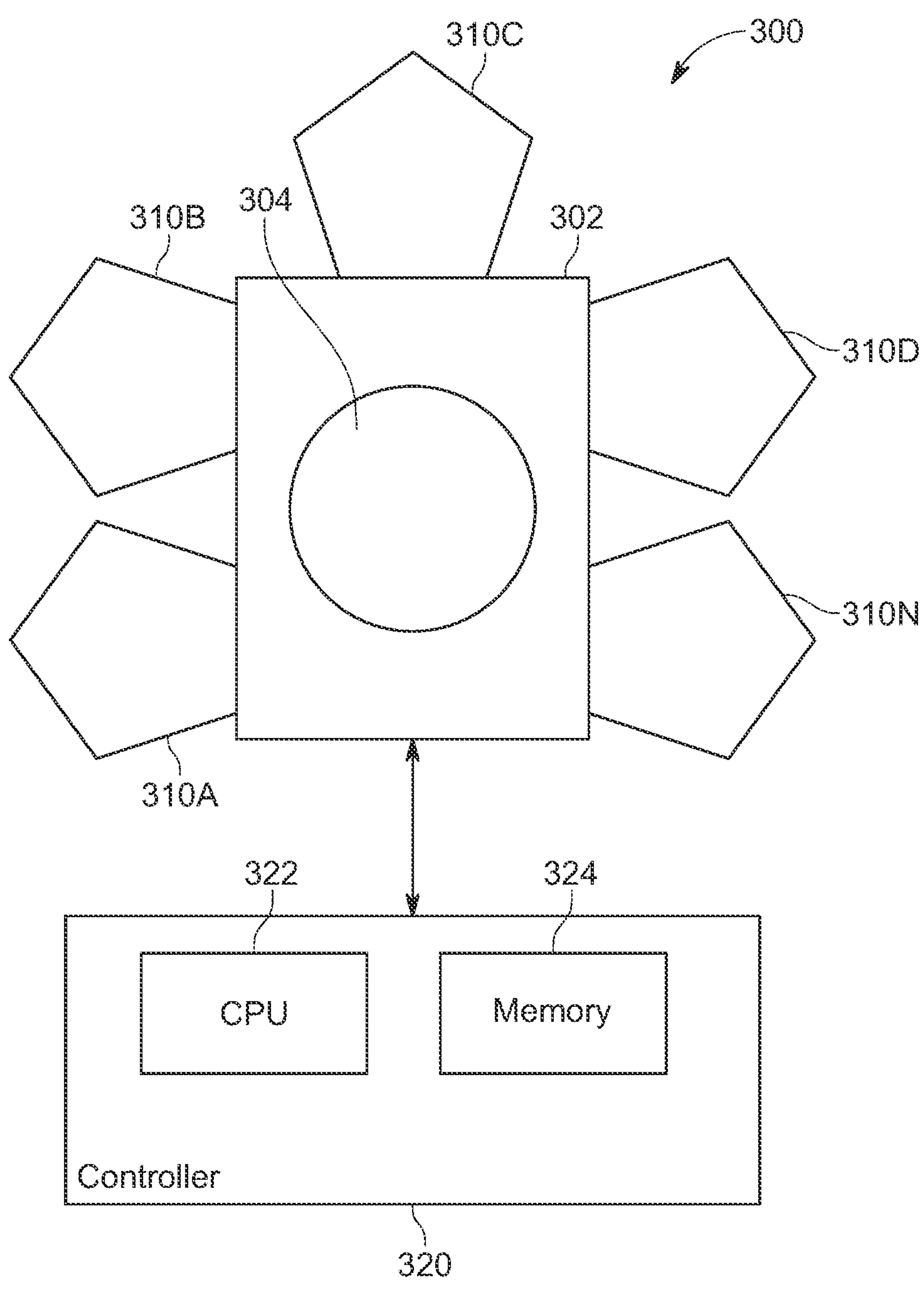
FIG. 4 illustrates a perspective view of an example processing system, according to embodiments of the present disclosure.

FIG. 4 shows a schematic of another example system/apparatus 300 according to embodiments of the disclosure. In some embodiments, the system 300 may be a cluster tool operable to perform processes necessary to form the device 100 described herein and shown in FIGS. 1A-1C. Although non-limiting, the system 300 may include at least one central transfer station/chamber 302 and one or more robots 304 within the transfer station/chamber 302, wherein the robot 304 is operable to move a robot blade and a wafer to and from each of a plurality of processing chambers 310A-310N connected with, or positioned adjacent to, the transfer station/chamber 302. In some embodiments, the processing chambers 310A-310N may support ion implantation, material deposition, and material etching. The particular arrangement of process chambers and components can be varied depending on the cluster tool, and should not be taken as limiting the scope of the disclosure. In another example, one or more of the chambers may include multiple process regions within a same chamber, which permits a common supply of gases, common pressure control, and common process gas exhaust/pumping. Modular design of the system enables rapid conversion from one configuration to any other.

In some embodiments, processing chamber 310A may be a deposition chamber operable to deposit the GAA stack 102 as alternating first layers 106 and second layers 108. The first deposition chamber 310A may be further used to deposit the plurality of outer gate spacers 122 along the sidewall 124 of each of the gate material layers 121 and along the plurality of alternating first layers 106 and second layers 108 of the nanosheet stack 102. In some embodiment, processing chamber 310A may be further operable to form the S/D 136 in the S/D cavity 130 following the first implant process 133 and/or second implant process 138. Although non-limiting, the deposition chamber may include one or more of an atomic layer deposition chamber, a plasma enhanced atomic layer deposition chamber, a chemical vapor deposition chamber, a plasma enhanced chemical vapor deposition chamber, or a physical deposition.

In some embodiments, processing chamber 310B may be an etch chamber operable to form the S/D cavities 130 through the plurality of alternating first layers and second layers 106, 108. The etch process may expose an upper surface of the STI layer 116 and the substrate base 104. Processing chamber 310B may be further operable to remove the second layers 108 from the GAA stack 102.

In some embodiments, processing chamber 310C may be operable to perform the first implant process 133, the second implant process 138, and/or the third implant process 142, in which fluorine ions or fluorine+carbon ions are directed into the GAA stack 102. The ions of the first implant process 133, the second implant process 138, and/or the third implant process 142 may be directed into the exposed surfaces of the GAA stack 102 at a non-zero angle θ relative to a plane defined by the exterior surface 135 of the outer gate spacers 122. In some embodiments, the first implant process 133 is performed at a temperature greater than approximately 500 degrees Celsius using a Thermion implant tool to reduce damage on Si of the GAA stack 102. In some embodiments, the second implant process 138 and/or the third implant process 142 are performed at room temperature or greater, e.g., by heating the platen upon which the device 100 is present.

In some embodiments, processing chamber 310D may be operable to perform one or more annealing processes, such as the anneal to the GAA stack 102 following the first fluorine or fluorine+carbon process, and the anneal(s) to the GAA stack 102 during RMG formation.

A system controller 320 is in communication with the robot 304, the transfer station/chamber 302, and the plurality of processing chambers 310A-310N. The system controller 320 can be any suitable component that can control the processing chambers 310A-310N and robot(s) 304, as well as the processes occurring within the process chambers 310A-310N. For example, the system controller 320 can be a computer including a central processor 322, memory 324, suitable circuits/logic/instructions, and storage.

Processes or instructions may generally be stored in the memory 324 of the system controller 320 as a software routine that, when executed by the processor 322, causes the processing chambers 310A-310N to perform processes of the present disclosure. The software routine may also be stored and/or executed by a second processor (not shown) that is remotely located from the hardware being controlled by the processor 322. Some or all of the method(s) of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor 322, transforms the general purpose computer into a specific purpose computer (controller) that controls the chamber operation such that the processes are performed.

In various embodiments, design tools can be provided and configured to create the datasets used to pattern the semiconductor layers of the device, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
forming a gate-all-around (GAA) stack comprising a plurality of alternating first layers and second layers;
forming a source/drain (S/D) cavity by etching the plurality of alternating first layers and second layers;
forming an inner spacer in the S/D cavity, adjacent the plurality of alternating first layers and second layers;
performing a first implant by directing fluorine ions to the GAA stack, through the S/D cavity, wherein the first implant is performed at a temperature greater than 500° Celsius;
forming a S/D material in the S/D cavity following the first implant; and
performing a second implant by directing fluorine ions to the GAA stack, wherein the second implant is performed before the S/D cavity is formed by etching the plurality of alternating first layers and second layers.

2. The method of claim 1, wherein the first implant further comprises directing carbon ions to the GAA stack together with the fluorine ions.

3. The method of claim 1, further comprising performing a third implant by directing fluorine ions to the GAA stack, wherein the third implant is performed after the S/D material is formed in the S/D cavity.

4. The method of claim 3, wherein the fluorine ions of the first implant, the second implant, or the third implant are directed as beamline ions into the GAA stack at a non-zero angle relative to a plane defined by a sidewall surface of the inner spacer.

5. The method of claim 3, wherein the second implant or the third implant further comprises directing carbon ions to the GAA stack.

6. The method of claim 3, wherein the first implant, the second implant, or the third implant comprises a plasma doping process.

7. A method for forming a gate-all-around (GAA) device, comprising:
forming a nanowire stack comprising a plurality of alternating first layers and second layers and an outer gate spacer adjacent the plurality of alternating first layers and second layers;
forming a source/drain (S/D) cavity by etching the plurality of alternating first layers and second layers, and by etching the outer gate spacer;
forming an inner spacer in the S/D cavity, adjacent the plurality of alternating first layers and second layers;
performing a first implant by directing fluorine ions to the inner spacer, through the S/D cavity, wherein the first implant is performed at a temperature greater than 500° Celsius;
forming a S/D material in the S/D cavity following the first implant; and
performing a second implant by directing fluorine ions to the outer gate spacer of the nanowire stack, wherein the second implant is performed before the S/D cavity is formed by etching the plurality of alternating first layers and second layers, and by etching the outer gate spacer.

8. The method of claim 7, wherein the first implant further comprises directing carbon ions to the nanowire stack together with the fluorine ions.

9. The method of claim 7, further comprising performing a third implant by directing fluorine ions to the outer gate spacer of the nanowire stack, wherein the third implant is performed after the S/D material is formed in the S/D cavity.

10. The method of claim 9, wherein the fluorine ions of the first implant, second implant, or third implant are directed as beamline ions into the nanowire stack at a non-zero angle relative to a plane defined by a sidewall surface of the inner spacer.

11. The method of claim 9, wherein the second implant or the third implant further comprises directing carbon ions to the nanowire stack together with the fluorine ions.

12. The method of claim 11, wherein the first implant, the second implant, or the third implant comprises a plasma doping process.

13. A system, comprising:
a processor;
a memory storing instructions executable by the processor to:
perform a first implant by directing fluorine ions into a gate-all-around (GAA) stack comprising a plurality of alternating first layers and second layers, wherein the fluorine ions are directed through a source/drain cavity formed adjacent the GAA stack, wherein the first implant is performed at a temperature greater than 500° C. Celsius, and wherein an outer gate spacer and an inner spacer are formed along the GAA stack before the fluorine ions are directed through the source/drain cavity; and
perform a second implant by directing fluorine ions to the GAA stack, wherein the second implant is performed before the source/drain cavity is formed by etching the plurality of alternating first layers and second layers.

14. The system of claim 13, the memory further storing instructions executable by the processor to epitaxially form a source/drain in the source/drain cavity following the first implant.

15. The system of claim 13, the memory further storing instructions executable by the processor to perform a third implant by directing fluorine ions to the GAA stack, wherein the third implant is performed after a source/drain is formed in the source/drain cavity.

16. The system of claim 15, wherein the first implant, the second implant, or the third implant further comprises carbon ions directed to the GAA stack together with the fluorine ions.

17. The system of claim 16, wherein the first implant, the second implant, or the third implant comprises a plasma doping process.

* * * * *